United States Patent

Hansen et al.

[11] Patent Number: 5,229,639
[45] Date of Patent: Jul. 20, 1993

[54] LOW POWDER DISTRIBUTION INDUCTANCE LEAD FRAME FOR SEMICONDUCTOR CHIPS

[75] Inventors: Kenneth M. Hansen, Poughkeepsie; David J. Perlman, Wappingers Falls, both of N.Y.

[73] Assignee: International Business Machines Corporation, Armonk, N.Y.

[21] Appl. No.: 786,240

[22] Filed: Oct. 31, 1991

[51] Int. Cl.$^5$ .................... H01L 23/48; H01L 23/50
[52] U.S. Cl. .................... 257/666; 257/691; 257/692
[58] Field of Search .................... 357/70, 68; 257/666, 257/691, 692

[56] References Cited

U.S. PATENT DOCUMENTS

| | | | |
|---|---|---|---|
| 4,862,245 | 8/1989 | Pashby et al. | 357/70 |
| 4,916,519 | 4/1990 | Ward | 357/70 |
| 4,965,654 | 11/1990 | Karner et al. | 357/70 |
| 5,068,712 | 11/1991 | Murakami et al. | 357/74 |
| 5,115,298 | 5/1992 | Loh | 357/70 |

FOREIGN PATENT DOCUMENTS 3-192735  8/1991  Japan .................... 357/70

Primary Examiner—Rolf Hille
Assistant Examiner—S. V. Clark
Attorney, Agent, or Firm—Whitham & Marhoefer

[57] ABSTRACT

A semiconductor integrated chip (IC) package has a lead frame for wire bonding IC chips contained therein. The lead frame power buses are arranged to minimize power bus inductance by assuring that a minimum distance is maintained between a current source path and a current return path which includes the wire bond connections to the chip. Distance is minimized by providing both the current source and current return pins in adjacent pin pairs on opposite sides of the package.

10 Claims, 5 Drawing Sheets

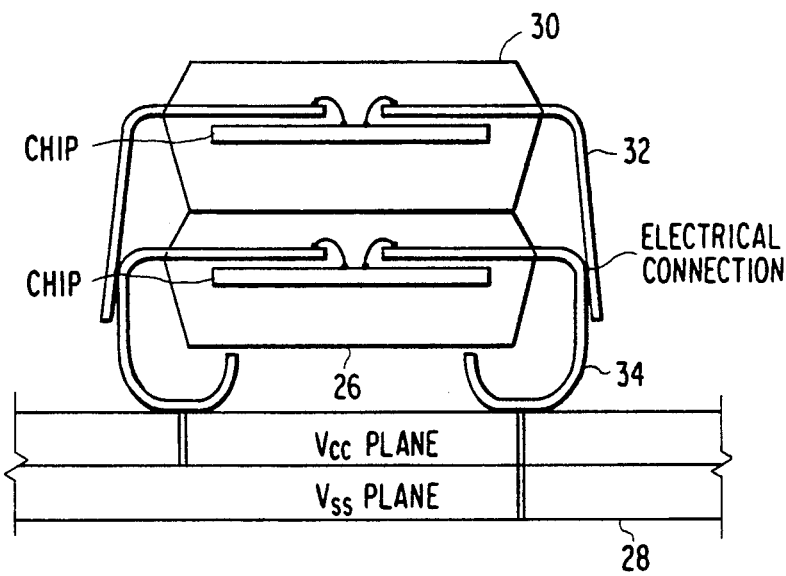
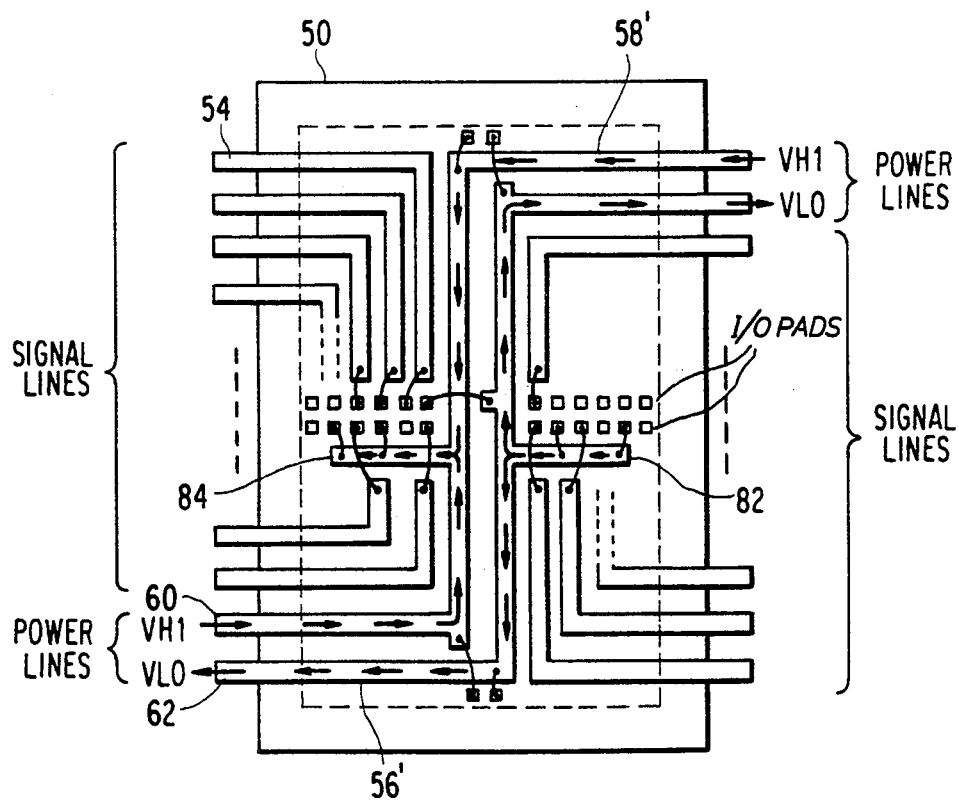

STIPPLED AREA REPRESENTS AREA OF INDUCTIVE LOOP DEFINED BY IDD CURRENT PATH

LOW POWDER DISTRIBUTION INDUCTANCE LEAD FRAME FOR SEMICONDUCTOR CHIPS

BACKGROUND OF THE INVENTION

1. Field of the Invention

The present invention generally relates to packages for integrated circuit (IC) chips and, more particularly, to a new lead frame for IC memory packages that minimizes the inductance in the power distribution network.

2. Description of the Prior Art

FIG. 1A shows a conventional A-wire lead frame 10 for a dynamic random access memory (DRAM) IC module 12. The lead frame 10 includes a plurality of signal leads 14 and two power bus leads 16 and 18 respectively connected to voltages $V_{cc}$ and $V_{ss}$, the latter typically being circuit ground. FIG. 1B is an end view of the DRAM module 12 showing how the A-wire lead frame 10 is attached to the top surface of the chip 20 and electrically joined to the chip signal and power pads 22 by wire bonds 24. As shown in FIG. 1B, the leads 14, 16, and 18 can be formed either as a J-lead or a gullwing lead for surface mounting on a printed circuit board (PCB).

Memory modules in the form of IC packages are conventionally mounted on PCBs in an array. In order to conserve board area, it is sometimes necessary to stack memory modules as shown in FIG. 2. In FIG. 2, a first DRAM module 26 is surface mounted to a PCB 28 and supports a second DRAM module 30. The leads 32 of the second DRAM module 30 overlap and are bonded to the leads 34 of the first DRAM module 26 forming an electrical connection therewith.

The A-wire lead frames used in the conventional IC modules shown in FIGS. 1 and 2 have a power distribution design as shown in FIG. 3A. This figure is similar to FIG. 1A but omits the signal leads and shows only the power buses 16 and 18 for the sake of clarity. As can be seen in FIG. 3A, there are several current loops for the current $I_{cc}$ flowing from the voltage source $V_{cc}$ to the voltage sink $V_{cc}$. However, by stacking memory modules, there is a very large inductive loop between the power buses causing high power supply noise, especially when more than two modules are stacked. This is best shown in FIG. 3B for a four module stack comprising modules 36, 38, 40, and 42. As can be seen in FIG. 3B, there is an increased inductance due to the power distribution to the top module 42, as indicated by the arrows for the $I_{cc}$ current path to chip and return. The noise is caused by the demand for current by the top module 42 when it becomes active. The high inductance in the circuit causes ringing on the $V_{cc}$ and $V_{ss}$ power distribution buses which adversely affect the voltage tolerance of the selected chip and can result in data integrity problems.

U.S. Pat. No. 4,862,245 to Pashby et al. discloses a package for an IC chip. The Pashby et al. patent is instructive for its explanation of the basic A-wire lead frame technology. In particular, Pashby et al. show power the bus bars for the A-wire lead frame. The power bus bars in this technology diverge away from each other at both ends and protrude from different sides of the package. This construction has a disadvantage of maximizing the flux linkage for a given current. As a result, the inductance of the lead frame is maximized except above the chip where the two power buses run parallel and close together and, as stated in the Pashby et al. patent, the wire bond leads to the chip power pads are shorter than in non-A-wire packages.

U.S. Pat. No. 4,965,654 to Karner et al. shows ground planes between the lead frame and the chip. These ground planes, however, have no effect on the power line inductance because the planes are separately connected to ground and high voltage and are not part of the current return path. The main function of the metal planes in the Karner et al. package are to provide shielding between signal lines and chip and to reduce coupling between adjacent lines by increasing signal capacitance to the shield planes.

U.S. Pat. No. 4,916,519 to Ward discloses an IC package using an A-wire lead frame. Ward shows how to reduce a long wire-bond connection from the lead frame to the chip by making two shorter bond connections between specially placed A-wire leads and the chip. Ward does not, however, address the problem of inductive coupling between stacked IC memory modules.

SUMMARY OF THE INVENTION

It is therefore an object of the present invention to provide a low power inductance lead frame for IC memory modules allowing a plurality of such modules to be stacked.

It is another object of the invention to drastically reduce the inductance of the vertical power leads of the memory package lead frame and those parts of the horizontal power leads that are attached to the power bus bars.

According to the invention, there is provided a new lead frame for a semiconductor IC package. The lead frame power buses are arranged to minimize power bus inductance by assuring that a minimum distance is maintained between a current source path and a current return path which includes the wire bond connections to the chip. Distance is minimized by providing both the current source and current return pins in adjacent pin pairs on opposite ends of the lead frame. This structure minimizes the area through which a magnetic flux passes due to current flowing from a first power bus to a second power bus, thereby minimizing the power distribution inductance. This new lead frame structure allows the stacking of a plurality of DRAM modules, resulting in substantial economies of packaging of memory systems.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is an end view showing the stacking of two memory modules;

FIG. 6 is a plan view of the lead frame structure according to another preferred embodiment of the invention.

DETAILED DESCRIPTION OF PREFERRED EMBODIMENTS OF THE INVENTION

Figure 4A:
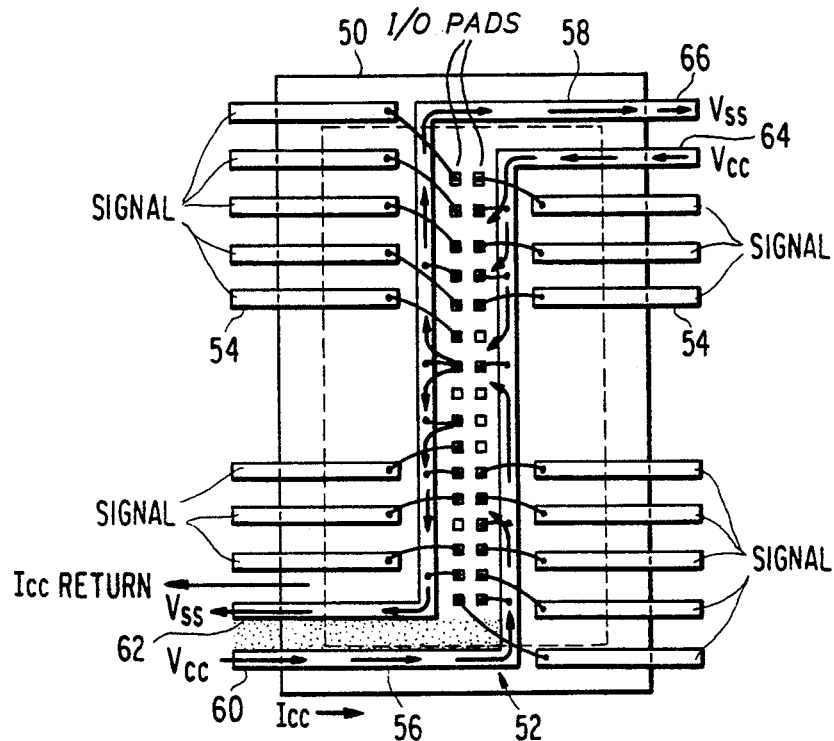
FIG. 4A is a plan view of the lead frame structure according to a preferred embodiment of the invention.

Referring again to the drawings, and more particularly to FIG. 4A, there is shown an IC module 50 having a lead frame 52 comprising a plurality of signal leads 54 and two power bus leads and 58. The power bus leads 56 and 58 are respectively connected to voltages $V_{cc}$ and $V_{ss}$ as in the conventional lead frame shown in FIG. 1A. However, the power bus leads 56 and 58 are connected to a first pair of pins 60 and 62 on one side of the module 50 and to a second pair of pins 64 and 66 on the other side of the module 50. In the illustrative preferred embodiment, the power bus leads 56 and 58 form a parallel serpentine pair which minimizes the distance between the two buses throughout the module 50.

Figure 3A:
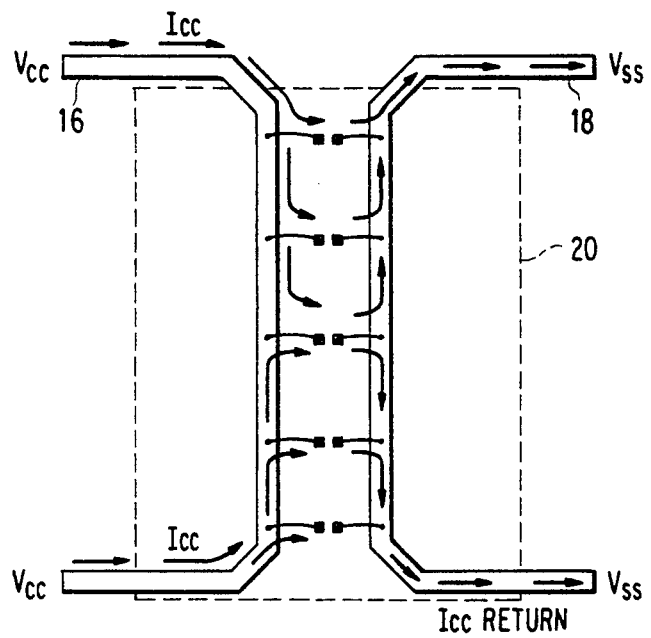
FIG. 3A is a plan view, similar to FIG. 1, showing the A-wire power bus structure.
Figure 3B:
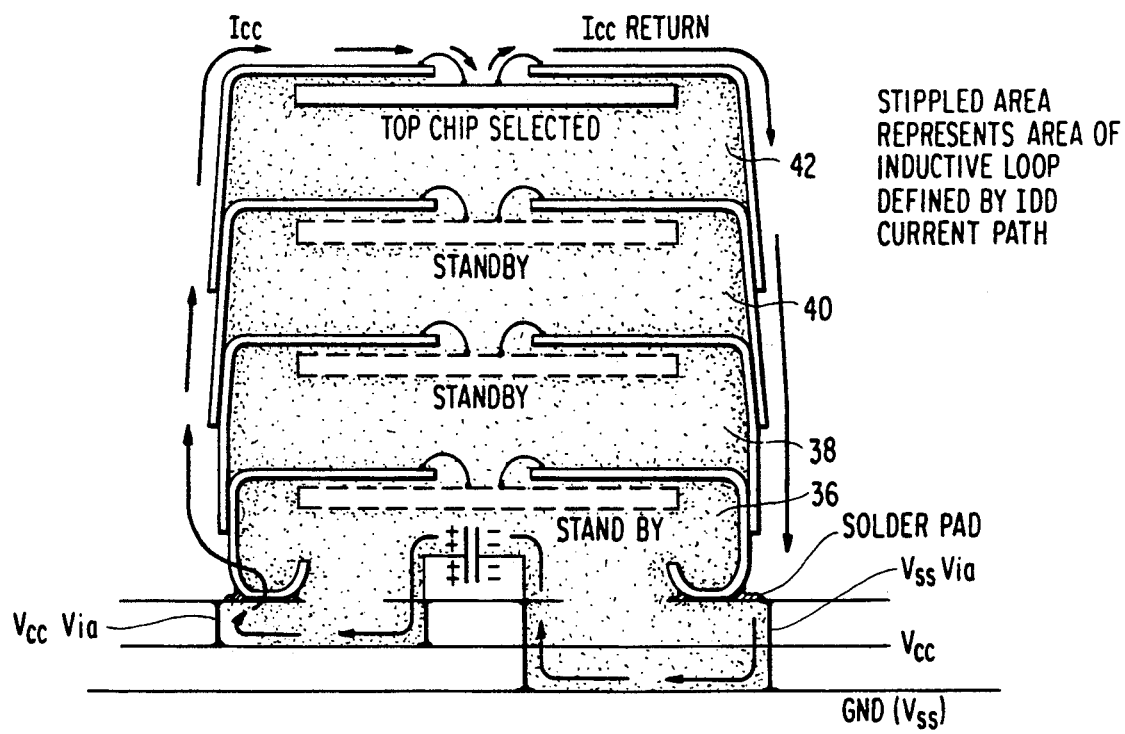
FIG. 3B is an end view showing the stacking of four memory modules and illustrating the area of the inductive loop defined by the $I_{cc}$ current path.
Figure 4B:
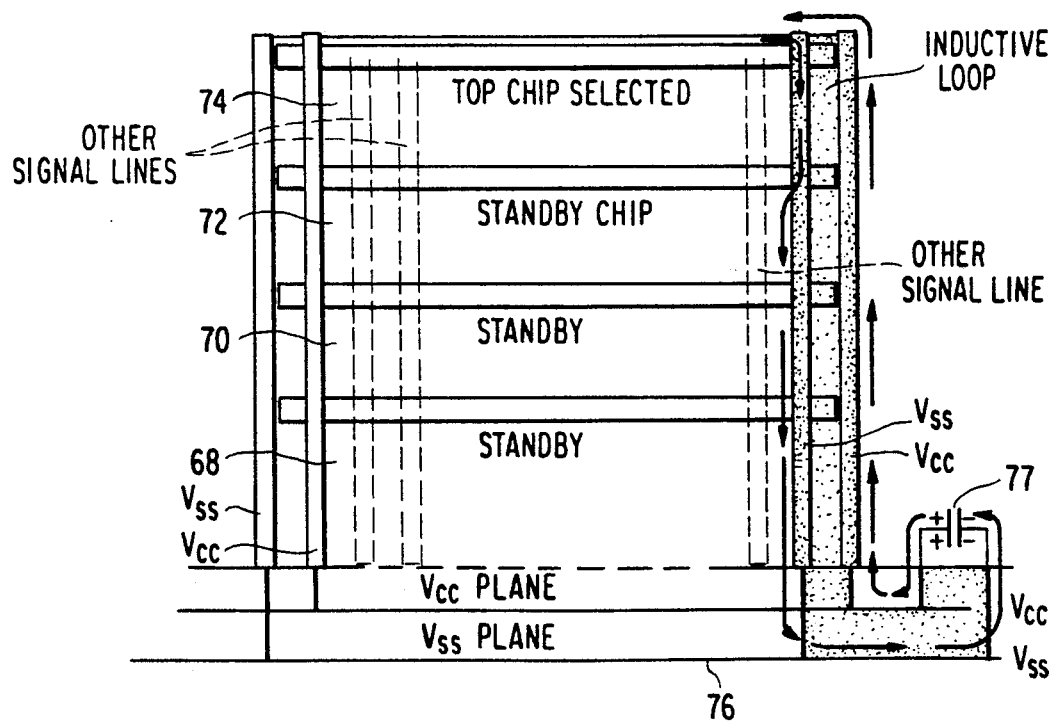
FIG. 4B is an end view showing the stacking of four memory modules and illustrating the area of the inductive loop for the new lead frame.

FIG. 4B shows a stack of four modules 68, 70, 72, and 74 mounted on a PCB 76. As can be seen in FIG. 4B, the inductive loop for the lead frame according to the preferred embodiment of the invention is minimized as compared with that for the conventional A-wire lead frame shown for a similar stack of four modules in FIG. 3B.

Figure 1A:
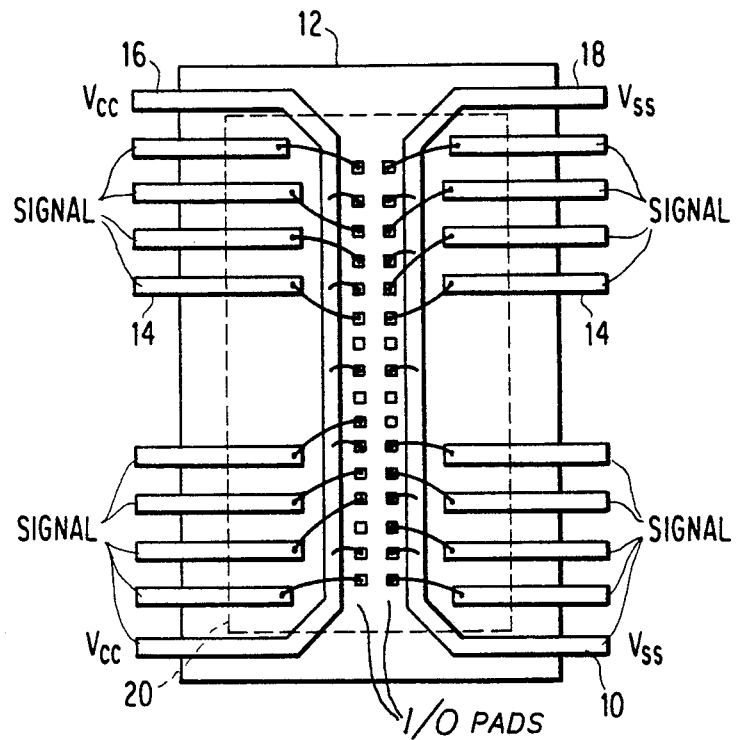
FIG. 1A is plan view of a conventional A-wire lead frame attached to an IC package.
Figure 1B:
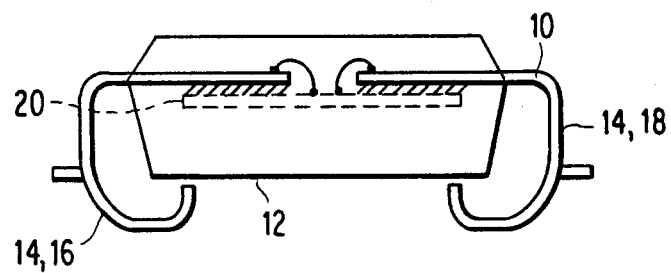
FIG. 1B is an end view of the IC package showing the lead frame attached to the top surface of a chip.

In both the conventional A-wire lead frame shown in FIG. 1A and the new lead frame shown in FIG. 4A, the power distribution circuit runs from the positive side of the closest decoupling capacitor 77 through part of the voltage plane to the $V_{cc}$ leads on the DRAM module, through the wire bonds and into the chip. The current return path is in the $V_{ss}$ leg of the package from the $V_{ss}$ wire bonds back to the ground terminal of the decoupling capacitor 77. The area of the inductive loop is formed by the current path to the ground side. Since a pair of $V_{cc}$ and $V_{ss}$ leads bring power to the chip, two inductive loops are formed and act in parallel. Therefore, one loop for each configuration can be analyzed to determine the superiority of the geometry according to the invention over the conventional A-wire lead frame.

The inductance, L, is proportional to the flux linked, $\Phi$, in the inductor that carries a current, I, according to the equation (1):

$$L = \frac{N\Phi}{I}, \quad (1)$$

where N is the number of turns or current loops. The flux linked is proportional to the area, A, of the loop through which the magnetic flux density passes according to equation (2):

$$L = \frac{NBA}{I}, \quad (2)$$

where B is magnetic flux density. Therefore, from equation (2), the area, A, must be minimized.

Figure 5A:
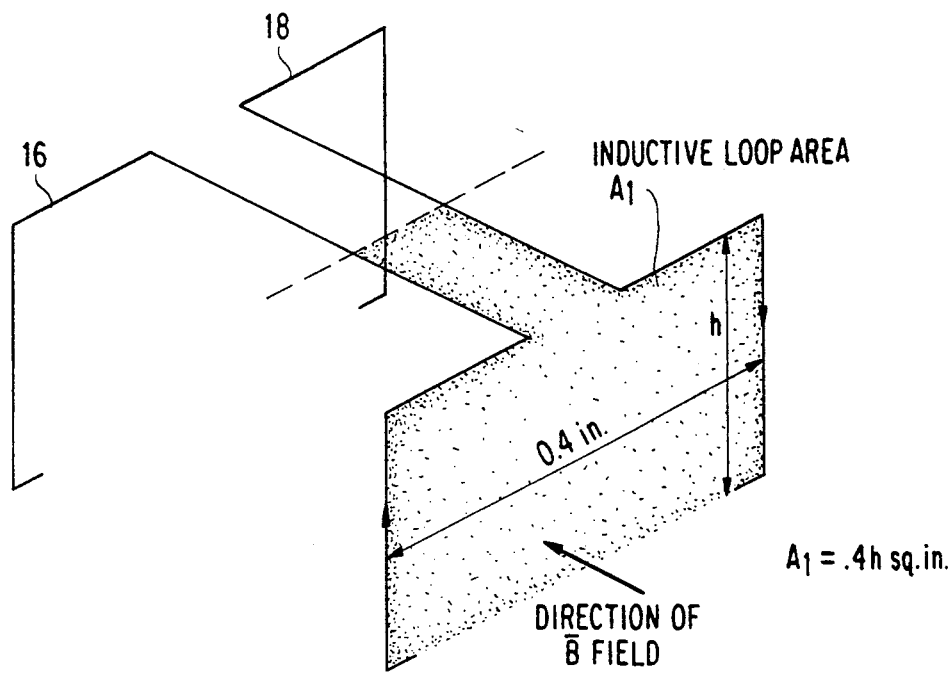
FIG. 5A is a schematic isometric view of the power distribution buses of the conventional lead frame shown in FIG. 1A.
Figure 5B:
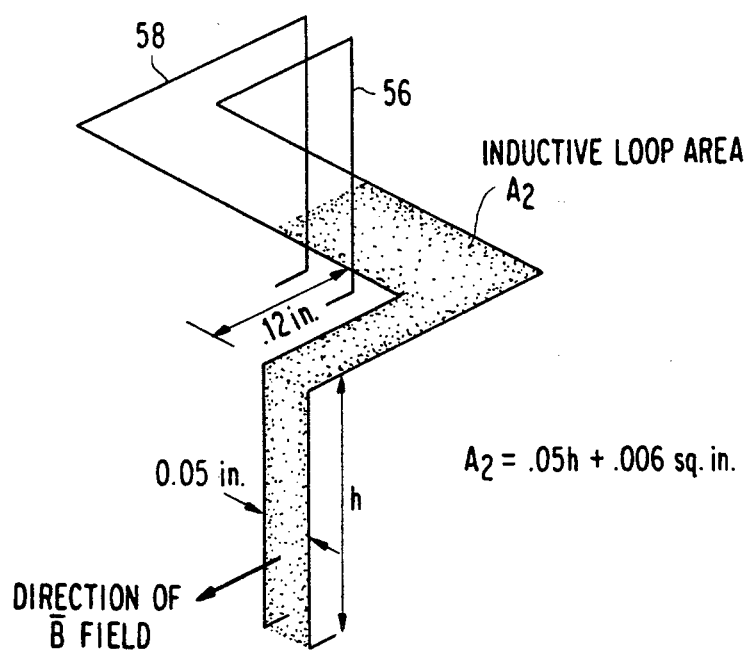
FIG. 5B is a schematic isometric view of the power distribution buses of the lead frame according to a preferred embodiment of the invention shown in FIG. 4A.

FIG. 5A shows in isometric schematic form the A-wire lead frame power buses 16 and 18 with some typical dimensions that form the area, A. In comparison, FIG. 5B shows in similar isometric schematic form the lead frame power buses 56 and 58 according to the present invention, also with typical dimensions that form the area, A. For the conventional lead frame shown in FIG. 5A, the loop area is 0.08 square inches, while the lead frame according to the invention has an area of 0.01 square inches. According to the definition of inductance, the lead frame according to the invention has approximately eight times less inductance in the power distribution network than the conventional lead frame, allowing a plurality of DRAM modules to be stacked without incurring the adverse effects of noise on the power distribution buses.

There are a number of possible variations to the preferred embodiment shown in FIG. 4A. One is shown in FIG. 6 where the input/output (I/O) chip pads are rotated 90° so that they run parallel to the short dimension of the chip package as shown in FIG. 6. Like reference numerals in FIGS. 4A and 6 designate identical components or structure, except in FIG. 6 the power bus leads are designated by the reference numbers 56' and 58'. The power bus leads 56' and 58' are provided with respective branches 82 and 84 along the side of the I/O pads for bond connection. These branches do not need to be connected at their terminus ends, at the printed circuit board, to the voltage supplies for any electrical reason, but they may be required to be shaped and formed as I/O pins to serve as mechanical support for the lead frame. The reason no electrical connection is required is because a high inductance loop would be created by the branches if they were to reach the supplies in the printed circuit board and, therefore, little or no power supply currents would flow in these branches from the printed circuit board to the power pads on the chip. All power supply current will come from the main buses 56' and 58' into the branches 82 and 84 to the power pads. The inductive loop analysis of FIG. 5B applies to the structure of FIG. 6 as well as to the structure of FIG. 4A.

While the invention has been described in terms of preferred embodiments, those skilled in the art will recognize that the invention can be practiced with modification within the spirit and scope of the appended claims. For example, while the preferred embodiments have been described in terms of dual in-line pin (DIP) packaging, the invention can be applied to other conventional and non-conventional packaging including single in-line packaging (SIP), such as single in-line memory modules (SIMMs), and packages having I/O pins on four edges.

Having thus described our invention, what we claim as new and desire to secure by Letters Patent is as follows:

1. In a semiconductor chip package having a semiconductor chip wire bonded to a lead frame therein, a low power distribution inductance lead frame comprising:

a first power bus in said lead frame providing a current source path; and a second power but in said lead frame providing a current return path, said first and second power buses entering said chip package adjacent each other, said current source path and said current return path being parallel and closely spaced throughout said lead frame so as to minimize an area through which a magnetic flux passes due to current flowing from said first power bus to said second power bus.

2. The low power distribution inductance lead frame as recited in claim 1 wherein said first and second power buses at point of entry in said chip package form closely spaced connecting pins on said semiconductor chip package.

3. The low power distribution inductance lead frame as recited in claim 2 wherein said closely spaced connecting pins are adjacent on a common edge of said package.

4. The low power distribution inductance lead frame as recited in claim 1 wherein said first and second power buses exit said chip package adjacent each other, said first and second power buses at points of entry to and exit from said chip package respectively from first and second pairs of closely spaced connecting pins on opposite edges of said semiconductor chip package.

5. The low power distribution inductance lead frame as recited in claim 4 wherein the pins of said first and second pairs of closely spaced connecting pins are each adjacent on opposite common edges of said package.

6. The low power distribution inductance lead frame as recited in claim 1 wherein said first and second power buses form a serpentine path through said semiconductor chip package.

7. The low power distribution inductance lead frame as recited in claim 6 wherein said first and second power buses are bonded to selected I/O pads of said semiconductor chip, which I/O pads run parallel to a long axis of said package.

8. The low power distribution inductance lead frame as recited in claim 6 wherein I/O pads of said semiconductor chip are oriented perpendicular to a long axis of said package, said first and second power buses having respective first and second branches parallel to said I/O pads and bonded to selected I/O pads.

9. A semiconductor chip package comprising:
a semiconductor chip;
a lead frame wire bonded to I/O pads of said semiconductor chip;
a first power bus in said lead frame providing a current source path; and
a second power bus in said lead frame providing a current return path, said first and second power buses entering said chip package adjacent each other, said current source path and said current return path being parallel and closely spaced throughout said lead frame so as to minimize an area through which a magnetic flux passes due to current flowing from said power bus to said second power bus.

10. The semiconductor chip package as recited in claim 9 wherein said first and second power buses form a serpentine path through said semiconductor chip package.

* * * * *